United States Patent [19]

Portner

[11] Patent Number: 5,288,313

[45] Date of Patent: Feb. 22, 1994

[54] ELECTROLESS PLATING CATALYST

[75] Inventor: J. Claude Portner, Juvisy-sur-Orge, France

[73] Assignee: Shipley Company Inc., Marlborough, Mass.

[21] Appl. No.: 531,156

[22] Filed: May 31, 1990

[51] Int. Cl.$^5$ ............................................. B05D 3/00
[52] U.S. Cl. ............................... 106/1.11; 106/1.19; 106/1.21
[58] Field of Search ............................. 106/1.11–1.28

[56] References Cited

U.S. PATENT DOCUMENTS

| | | |
|---|---|---|
| 3,011,920 | 12/1961 | Shipley . |
| 3,445,350 | 5/1969 | Klinger et al. ............ 204/30 |
| 3,471,313 | 10/1969 | Saubestne et al. ............ 427/304 |
| 3,560,257 | 2/1971 | Schneble et al. ............ 428/137 |
| 3,661,597 | 5/1972 | Gulla ............ 106/1 |
| 3,728,137 | 4/1973 | Shipley et al. ............ 106/1 |
| 3,754,070 | 8/1973 | Dunn et al. ............ 264/272 |
| 3,765,936 | 10/1973 | Shipley et al. ............ 174/256 |
| 3,940,533 | 2/1976 | Arsac ............ 428/225 |
| 3,958,066 | 5/1976 | Imamura et al. ............ 428/372 |
| 4,113,658 | 9/1978 | Geus ............ 252/454 |
| 4,126,582 | 11/1978 | Diem et al. ............ 252/476 |
| 4,253,875 | 3/1981 | Heymann et al. ............ 106/1.26 |
| 4,447,492 | 5/1984 | McKaveney ............ 428/328 |
| 4,511,494 | 4/1985 | Frommer et al. ............ 252/518 |
| 4,514,486 | 4/1985 | Shirose et al. ............ 430/124 |
| 4,556,507 | 12/1985 | Tomibe et al. ............ 252/518 |
| 4,639,380 | 1/1987 | Amelio et al. ............ 427/97 |
| 4,663,240 | 5/1987 | Hajdu ............ 428/545 |
| 4,670,306 | 6/1987 | Salem ............ 427/258 |
| 4,696,764 | 9/1987 | Yamazaki ............ 106/1.12 |
| 4,752,415 | 6/1988 | Iwasakow et al. ............ 252/511 |
| 4,774,270 | 9/1988 | Sullivan et al. ............ 523/334 |
| 4,775,557 | 10/1988 | Bastenbeck et al. ............ 427/307 |
| 4,783,243 | 11/1988 | Ando et al. ............ 204/15 |
| 4,820,553 | 4/1989 | Sopchak et al. ............ 427/304 |
| 4,863,758 | 9/1989 | Rhodenizer ............ 106/1.11 |
| 4,868,008 | 9/1989 | Marikar et al. ............ 427/126.1 |
| 4,895,739 | 1/1990 | Beadon ............ 427/304 |
| 4,981,725 | 1/1991 | Nuzzi et al. ............ 427/304 |

FOREIGN PATENT DOCUMENTS

| | | | |
|---|---|---|---|
| 676894 | 12/1963 | Canada ............ | 427/304 |
| 512204 | 4/1976 | U.S.S.R. ............ | 106/1.28 |
| 2169925A | 1/1986 | United Kingdom . | |

*Primary Examiner*—Mark L. Bell
*Assistant Examiner*—Margaret Ethsmann
*Attorney, Agent, or Firm*—Robert L. Goldberg

[57] ABSTRACT

The invention discloses a new electroless plating catalyst and a process of using the same for selective plating. The catalyst and process are especially adapted for formation of EMI shielding for electronic components. The electroless plating catalyst comprises catalytic particulates dispersed in a liquid film forming composition.

31 Claims, No Drawings

ELECTROLESS PLATING CATALYST

BACKGROUND OF THE INVENTION

1. Introduction

This invention relates to a process and materials for electroless metal deposition. More particularly, this invention relates to a novel electroless plating catalyst comprising a particulate having a catalytic coating uniformly dispersed in a liquid carrier and to a metal coating process using said plating catalyst. The plating catalyst and process are especially suitable for selective electroless metal deposition such as in the formation of electromagnetic interference (EMI) and radio frequency interference (RFI) shielding for housings for electronic equipment.

2. Discussion of Prior Art

Electromagnetic interference emissions are undesirable energy emissions within a frequency range of from less than 60 Hz to more than 1,000 MHz. Radio frequency interference (RFI) is the portion of EMI radiation in about the 0.01 to 1,000 MHz range.

EMI radiation is created by operation of many diverse forms of electronic equipment ranging from microwave equipment to home computers. The radiation occurs because electronic devices emit "noise" in the above frequency range that is picked up by other devices or by conduction through power lines that act as antennas. EMI radiation may interfere with other devices and has been known to cause such diverse problems as interference with police mobile radios, communication systems, scientific test equipment and cardiac pacemakers.

In recent years, the use of electronic equipment in the home and work place has grown rapidly with a concomitant increase in sources of EMI emissions. Additionally, most housings for electronic equipment are now fabricated from plastic rather than metal. Plastics are lighter, more versatile, easier to fabricate and less expensive than metal but do not possess the intrinsic EMI/RFI shielding capabilities provided by metal enclosures.

The Federal Communications Commission has published a series of regulations concerning standards for maximum allowable EMI emissions for electronic devices. The regulations, which became effective in October 1983, apply to all digital electronic products that use or generate frequencies between 10 KHz and 1,000 MHz. These regulations therefore include commercial, industrial, business, and home products such as computers, calculators, cash registers, electronic typewriters, video equipment, and electronic games. The regulations require that the electronics industry develop electronic devices which have electromagnetic compatibility (EMC); in other words, equipment which neither interferes with other devices nor is itself susceptible to interference.

One approach to limiting electromagnetic containment is the use of an EMI shield to contain the radiation. Containment requires special shielding materials, components, and structures which prevent generated energy from escaping and acting as a source of disturbance.

The effectiveness of electromagnetic containment is determined by the degree to which the field strength is attenuated as a result of reflection or absorption by the shielding material. Shielding efficiency is calculated as a logarithmic function of the ratio of unshielded EMI transmission to shielded EMI transmission and is expressed in decibels. Because of the logarithmic nature, an increase of 30 db in shielding efficiency for a given wavelength or frequency of electromagnetic radiation represents a 1,000 percent increase in the shielding efficiency of the coating. A coating with a shielding efficiency of 30 db, for example, eliminates 99.9% of the total EMI radiation. A 60 db coating eliminates 99.9999% of the total EMI radiation.

There are several shielding methods in commercial use for nonconductive materials. The method most often used involves a metallic coating applied over a plastic housing for the electronic device. An early publication showing the use of multiple metal coatings over a plastic housing is *Engineering*, 9, Dec., 1966, pp. 1026 and 1027. Methods for applying metallic coatings disclosed in this reference include galvanic deposition, spray coating, chemical metallizing and vacuum metallizing. Metal coatings include copper, silver, chromium, nickel, silver, gold, zinc, etc.

Metals are applied over housings for electronic equipment in a number of ways. For example, EMI shielding materials have been arc-sprayed (zinc) and painted with metal-containing paints (nickel) onto the electronic housings. Both of these methods have serious disadvantages. Arc-sprayed zinc is an effective EMI shield with attenuation to 120 db or more. However, zinc is toxic and expensive, the procedure is labor intensive, and the coating is prone to cracking and peeling. Conductive nickel paints are easier to apply than arc-sprayed coatings, but do not cover recessed areas, provide attenuation to only 20 to 60 db and often require multiple coatings.

Silver and copper conductive paints have also been used in the manufacture of EMI shielding. Silver is a good conductor, but is expensive and oxidizes. Copper conductive paints are easy to apply, economical, used with conventional equipment, are wear resistant and have good resistance to flaking. However, copper tends to oxidize which results in a loss of conductivity and a concomitant loss of shielding effectiveness Other methods for applying metallic coating include cathode sputtering and vacuum metallizing. Such coatings show good conductivity and good adhesion, but require expensive equipment for application, are prone to microscopic cracking, can distort thermoplastics, require high power, are batch operations and are limited by part configuration.

Recently, interest has been generated in the use of electroless metals for EMI shielding. Electroless plating of surfaces for EMI shielding is shown in the prior art as early as 1967. Lordi, *Plating*, Vol. 54, p. 382, (1967), incorporated herein by reference, discusses the use of both electroless copper and electroless nickel as shielding materials. Lordi discusses electronic applications for electroless copper and electroless nickel specifically noting EMI shielding, teaches that electroless nickel can be used as an intermediate coating over copper to prevent corrosion and finally, that electroless copper can be protected by a coating of a second metal to prevent oxidation.

Recently, a number of publications have discussed the use of electroless metals for EMI applications. *Plastics Technology*, Vol. 27, June '81 p. 67, teaches the use of electroless metals as EMI shielding materials. *Plastics World*, Vol. 40, pp. 40–45, September 1982 states that electroless plating may be less expensive than many of the shielding processes now in use and can give comparable shielding performances. The economy of application of electroless plating for EMI shielding is demonstrated in a 1982 article in *Industrial Finishing*, Vol. 58, pp.100 to 101. Smoluk, *Modern Plastics*, September '82, pp. 48–51 cites several commercially available electroless plating systems for shielding applications. Smoluk reports electroless copper coatings with demonstrated SE values of 80 to 116 db, and electroless nickel coatings with SE values exceeding 45 db.

As discussed in the literature, both electroless copper and electroless nickel have been used in the electroless plating of plastic substrates. Both have advantages and disadvantages. Copper, with a relative conductivity of 1.0 (second only to silver with a conductivity of 1.05), has high shielding effectiveness. An additional advantage of copper is a relatively low cost. Disadvantages of copper are relatively low abrasion (wear) resistance and a relatively poor corrosion resistance with a strong tendency to oxidize which significantly reduces the shielding effectiveness.

Electroless nickel serves as a good paint base, has high wear resistance, stable electrical contact resistance, good solderability, and good corrosion resistance. *Plastic Design Forum*, November/December 1982, pp. 17–26, states that while electroless nickel is less conductive than electroless copper and therefore less effective as a shielding material, it possesses better corrosion resistance and may be preferable to electroless copper for EMI shielding applications, especially in severe environmental conditions. The major disadvantage to use of electroless nickel is its low relative conductivity of 0.20 or less. However, electroless nickel is relatively expensive and therefore, high cost is a disadvantage to the use of electroless nickel as a shielding material.

Disadvantages attendant to the use of electroless copper and electroless nickel separately as shielding materials are partly overcome by a dual layer of electroless copper overplated with electroless nickel. Such a dual layer is believed to be first suggested by Lordi (supra) in 1967. In 1983, Krulik, in *Industrial Finishing*, May, 1983, pp. 16–18, states that "the (electroless) copper's disadvantages are overcome by coating the copper layer with a thin layer of electroless nickel. The electroless nickel is deposited to protect the copper. The nickel's relative high cost is minimized by the thinness of the layer." A 1983 article by Hadju and Krulik in *Plating and Surface Finishing*, July, 1983, pp. 42–44, states that "a composite coating of electroless copper with a top layer of electroless nickel will combine the desirable characteristics of both. There is no degradation of the excellent shielding properties of electroless copper which can be adjusted in its shielding efficiency by varying its thickness. A relatively thin coating of electroless nickel provides corrosion resistance, paint adhesion, stable low electrical contact resistance, and other desirable properties and may be maintained at a constant thickness". A dual layer of electroless copper coated with electroless nickel is also disclosed in U.S. Pat. No. 4,514,486 incorporated herein by reference. This configuration utilizes the high conductivity of the electroless copper for EMI attenuation and the corrosion resistance of the electroless nickel to protect the copper against oxidation.

Briefly, electroless plating of plastics comprises immersing a part in a series of aqueous baths which both prepare the surface of the part for deposition and permit metallization. Following conventional pretreatment steps, a part to be plated is then immersed into a catalyst solution containing noble metals to render nonconductive surfaces catalytic to deposition of the desired plating metal. An example of a noble metal catalyst is disclosed in U.S. Pat. No. 3,011,920 incorporated herein by reference. The patent teaches treatment of the dielectric substrate with a colloidal palladium solution to render it catalytic to deposition of the dissolved metal.

Following catalysis, the part is then immersed into an electroless plating solution containing dissolved metals which, in contact with the plating catalyst, results in deposition of a coating of the metal onto the catalyzed surface.

Known procedures for electroless deposition of metal for EMI shielding are acknowledged by the art to provide superior coatings. However, one problem associated with their use is that the coating process is not selective. Coating is by immersion of the entire part to be plated into a liquid treatment solution—i.e., a colloidal catalyst solution followed by a metal plating solution. The result is that metal is plated over the entire surface of the nonconductor. Where aesthetics are important in the marketing of electronic components, a metal coated housing for the component is undesirable and typically, the industry paints the metal coating. This is a time consuming and wasteful step, especially where housings are most often molded in a desired color. For this reason, it would be desirable to have a selective process for plating only the interior of the housing without plating the exterior of the housing.

An attempt at selective plating of housings for EMI protection is disclosed in U.S. Pat. No. 4,670,306 incorporated herein by reference. In this patent, a process is taught comprising applying an adsorptive coating onto selected portions of an electronic housing where plating is desired. Selectivity is achieved by a masking procedure. This creates areas on the housing of differential adsorptivity. Thereafter, the housing is immersed in a catalyst solution and more catalyst is absorbed onto the absorptive coating than onto the balance of the housing thereby permitting selective metal deposition. In commercial practice, however, it has been found that selectivity is not adequate because of the required close control of all plating variables to obtain selectivity.

In published U.K. Patent Application Serial No. 2 169 925 A, incorporated herein by reference, another process for selective plating for EMI shielding applications is disclosed. In this process, a lacquer is used having suspended particles of metal which may be in the form of flakes, fibers, particulates and in one embodiment, commercially available silver coated glass spheres. The part to be plated is masked where plating is undesired, spray coated with the lacquer where plating is desired, the mask is removed and the part electrolessly metal plated selectively in a pattern conforming to the lacquer coating. The process of U.K. Application Serial No. 2 169 925 A is an improvement over that of above referenced U.S. Pat. No. 4,620,306 in that better selectivity is obtainable With fewer processing steps. However, a problem encountered with the process is the need to expose and treat metallic (catalytic) particles embedded in and sealed by the lacquer coating during coating and drying to form initiation sites for metallization. The steps of exposing and/or treating the particles prior to plating are costly and time consuming. Additional problems are encountered due to the high levels of metal loading in the lacquer which are normally in the order of 50% w/w. A high loading of metal is costly and the coating formed using this lacquer is rough in appearance as a consequence of the high solids content of the lacquer. Moreover, and possibly due to the rough surface, the metallic particles are poorly adhered to the substrate, flake off during processing and can fall into circuitry causing equipment problems and failures.

SUMMARY OF THE INVENTION

The invention described herein comprises a new electroless plating catalyst and process using the catalyst and is an improvement over the plating catalyst and process disclosed in the aforesaid U.K. Patent Application No. 2,169,925A. The plating catalyst of this invention comprises a mixture of catalytic particles dispersed in a liquid coating composition. The catalytic particles are formed of a reduced metal salt that is an electroless plating catalyst coated on an inert particulate carrier. The electroless plating process of the invention is characterized by fewer processing steps and is an improvement over the process of U.K. Patent Application No. 2,169,925A in that it does not require a step of exposing and/or treating the catalytic metal particles prior to electroless metal plating as is required in said U.K. Patent Application. The process of the invention permits plating at a good plating rate and results in a deposit that is and remains strongly adhered to its underlying substrate during prolonged use. The invention is especially useful for formation of selectively deposited metal coatings and is especially suitable for the formation of EMI coatings on housings for electronic components.

The electroless plating catalyst of the invention comprises a mixture of several different catalytic particles dispersed in a liquid coating composition. Each of the catalytic particles comprises a reduced noble metal salt, believed to be in the form of a hydrous oxide, deposited onto inert carrier particles such as colloidal carbon or silica. Preferably, the carrier particles are irregularly shaped and possess jagged edges and most preferably comprise colloidal silica. The liquid coating composition used to carry the catalytic particles is a resin in a solvent such as a paint or varnish base and may be organic or aqueous, but is preferably an organic lacquer made using a solvent that softens the top surface of the nonconductor over which metal is to be plated.

Using a preferred electroless plating catalyst for purposes of illustration, upon application of a catalyst on a plastic substrate, the solvent from the coating composition solvates and softens the plastic. This results in bonding the polymer phase of the coating composition to the plastic substrate over which the catalyst is coated resulting in bonding of the catalytic particles to the substrate. For reasons to be more fully explained below, the catalytic particles protrude from the surface of the coating and are readily metal plated without treatment to expose the particles as required in the prior art. Additionally, the particles are firmly adhered to the substrate and do not flake off during prolonged use of the article. The metal coating formed over the electroless plating catalyst is relatively smooth compared to coatings obtained using the catalyst of the aforesaid U.K. Patent Application.

The electroless plating catalyst of the invention is especially adapted for selective pluting. When selectively applied, using conventional masking and spraying procedures as more fully explained below, metallization over the substrate will be selective and in conformity with the applied catalytic coating.

DESCRIPTION OF THE PREFERRED EMBODIMENTS

As aforesaid, the electroless plating catalyst of the invention comprises a mixture of catalytic particles dispersed in a liquid coating composition where the catalytic particles comprise a reduced catalytic metal over an inert carrier particle and the liquid coating composition comprises one or more film forming resins and other additives dissolved in a solvent.

In accordance with the invention, inert carrier particles over which the reduced catalytic metal may be deposited include known colloidally dispersed particles such as carbon; various types of silicas including synthetic calcined silicas (produced by heating with a flame), synthetic precipitated silicas (produced by chemical reaction), silicas of fossil origin (diatomaceous), detritic natural silicas (powdered or micronized sand); alumina; pigments such as titanium dioxide; etc. Silica is a preferred carrier. Most preferred is an organically coated silica where the organic coating aids in the prevention of settling of the silica from the coating composition during storage. An example of a preferred silica is ED-30 available from W. R. Grace Ltd.

The particle size of the inert carrier particles may range within wide limits, but preferably ranges between about 0.1 and 500 microns, more preferably between about 1 and 250 microns and most preferably between about 1 and 50 microns. The surface areas of such particles typically range between 100 and 900 $m^2/gm$.

In a preferred embodiment of the invention, the inert carrier particles are irregularly shaped rather than smooth such as glass beads. Irregularly shaped particles have jagged edges which penetrate a dried coating following application and drying of the plating catalyst on a substrate. This facilitates initiation of the plating reaction without a need to treat the dried coating to expose the catalytic material.

Various liquid coating compositions containing film forming resins may be used as the carrier for the catalytic particles of the invention. Useful aqueous based coating compositions include solutions of polymers such as acrylic homopolymers or copolymers; polyurethanes; polyamides; polyesters; alkyd resins; ethylene copolymers with acrylates or vinyl acetate; chlorinated or unchlorinated homopolymers or copolymers of vinyl chloride; vinyl acetate or vinyl proprionate; cyclisized or chlorinated rubber; nitrocellulose; ethyl or ethylhydroxy cellulose; coumarine-indene resins; terpene resins; polyvinyl acetal resins; cellulose esters such as cellulose acetobutyrate and cellulose acetoproprionate; shellac; and other natural resins singularly or in combination.

Organic solvent based liquid coating compositions containing film forming resins include solutions of phenolics; epoxies; polyesters; acrylics; hydroxylated copolymers of vinyl chloride and vinyl acetate; amine or amide resins such as polyamides; urea formaldehyde; melamine formaldehyde resins; hexamethoxymethyl melamine; benzoguanamine-formaldehyde resins; isocyanates; etc.

In general, catalytic particles are prepared over inert carrier particles by forming a mixture of a salt of the noble catalytic metal, a reducing agent for the catalytic metal and the inert colloidal particles in a solvent or a mixture of a solvent and the liquid coating composition.

Preferably, a paste is first made of the catalytic material, the reducing agent and the inert carrier particles and this paste is then mixed with the liquid coating compositions to form a plating catalyst composition. The solution soluble reducing agent reduces the salt of the catalytic metal to its reduced form thereby causing in situ adsorption of the reduced catalytic metal on the carrier particle. The catalytic particles may be formed in either organic or aqueous media. Once formed, the catalytic particles, preferably initially in the form of a paste, may be mixed with additional liquid coating composition to provide a coating composition of adequate dilution. If an organic liquid coating composition is used, the catalytic particles are preferably formed in organic solvent. Alternatively, if an aqueous liquid coating composition is used, the catalytic particles are preferably formed in aqueous solution.

A process for the making of the electroless plating catalyst of this invention in summary form is illustrated in the following steps:

Step a. form a first catalytic particle by dissolving a first noble metal salt from the platinum family of metals in a solvent in which an inert colloidal carrier particle is then dispersed and reduce the noble metal salt with a suitable reducing agent to form a colloidal dispersion of the reduced platinum family metal adsorbed onto the inert carrier particles;

Step b. form a second catalytic particle by dissolving a silver salt in a solvent in which an inert colloidal carrier particle is then dispersed and reduce the silver salt with a suitable reducing agent to form a colloidal dispersion of reduced silver adsorbed onto the inert carrier particles; and Step c. mix the carrier particles formed in steps a. and b. and add additional liquid coating composition as needed for proper dilution to form the electroless plating catalyst.

As aforesaid, the solvent used in steps a. and b. may be a combination of a solvent and the liquid coating composition.

Any platinum family metal salt may be used as the catalytic metal in the formation of the catalytic particle in step a. above. Suitable platinum family metals include platinum, ruthenium, rhodium, palladium, etc. Palladium is the preferred metal. Silver is used for the formation of the second catalytic particle as it has been unexpectedly found that the combination of a platinum family catalytic metal and silver as a catalytic metal comprise a synergistically active combination in the formation of a plating catalyst in accordance with the invention. Without wishing to be bound by theory, this synergistic effect is believed to result from the platinum family metal providing a rapid initiation of the deposition reaction and the silver assisting in the spread of the metal deposit once deposition is initiated.

In that embodiment of the invention where the electroless plating catalyst is dispersed in an organic medium, the catalytic particles are formed using a step of dissolving an appropriate salt of the catalytic metal in an organic solvent containing the carrier particles. The solvent used typically is an organic solvent in which the metal salt will dissolve and which is compatible with the liquid coating medium. It is also desirable that the organic solvent solvate or condition the substrate over which the catalytic coating composition is coated in order to promote bonding or adhesion of the coating of the catalyst to the substrate. Solvation of the substrate, as is known in the art, means softening the substrate without dissolving the same. This permits penetration of the substrate by the coating medium.

Solvating solvents for ABS are shown in U.S. Pat. No. 3,445,350 incorporated herein by reference. Solvating solvents for other polymers are disclosed in U.S. Pat. No. 3,754,070, also incorporated herein by reference. To dissolve the salt and to solvate the substrate, it is preferred that a polar solvent be used, more preferably an oxygenated solvent such as an alcohol, ether or ether acetate. Suitable solvents include isopropyl alcohol, ethanol, methanol, acetone, methyl ethyl ketone, ethyl acetate, the Cellosolve acetates such as butyl cellosolve acetate and propylene glycol alkyl ether acetate, butyl carbitol, etc. Preferably, the solvent is a mixture of an alcohol with acetone and an alkylated ester such as ethyl acetate or butyl acetate, most preferably in a ratio of 1.0 to 2.0 to 6.0 to 1.0. The combination of a specific solvent with a specific substrate would depend upon the solvency of the solvent for the substrate. Solvents used to formulate the electroless plating catalyst can also be used to dilute the same as necessary for use.

Following formation of the solution of the catalytic metal salt in its solvent, the inert carrier particles may be added using mixing techniques known to those skilled in the art. Thereafter, a reducing agent is added to reduce the metal in solution to a reduced form believed to be either a metal or a hydrous oxide or oxide of the metal. In the preferred process, the solvent content of the mixture at this point in the process for formation of the catalytic particles is only sufficient to form a highly viscous or paste composition. The reduced metal or metal oxide, is adsorbed onto the inert carrier particles in the admixture both during and subsequent to reduction. Suitable reducing agents include hydrazine, borohydrides, amine boranes and stannous tin. Stannous tin is the preferred reducing agent. The choice of reducing agent is such that the reduction occurs at or near the redox potential for the catalytic metal ion.

The concentration of the additives in solution following dilution of the paste with the liquid coating composition and/or additional solvent (not the final motal content in a plating catalyst solution ready for use), is not critical. The platinum family metal (expressed as the metal) is preferably used in an amount of from about 0.1 to 100.0 grams per liter of solution and more preferably, in an amount of from 1.0 to 10.0 grams per liter. The silver salt (expressed as metallic silver) is preferably used in an amount of from about 1.0 to 100.0 grams per liter of solution, more preferably, in an amount of from about 3.0 to 20.0 grams per liter and most preferably, in an amount of from 5.0 to 10.0 grams per liter. The reducing agent is added in an amount at least equal to the stoichiometric amount required to reduce the metal ions to the reduced form. The inert colloidal particulate over which the noble metal deposits is present in each of the platinum family metal solution and the silver solution in an amount of from 1 to 50 times the weight of the platinum family metal or the silver and more preferably in an amount of from 5 to 15 times the weight of the metals.

Preparation of catalytic particles will be more fully explained by a specific example using the steps outlined above. Using palladium as the first catalytic metal, suitable palladium salts for formation of the catalytic particles include palladium chloride and diaminodichloro palladium complex. A suitable reducing agent would be tin chloride, hydrazine or other derivatives compatible with the medium and of sufficient strength to effect reduction. Reduction of the palladium ions occur at its redox potential of $+1.0$ v $+/-0.1$ v using the preferred reducing agent, stannous tin. The palladium salt is dissolved in solution preferably acidified with an acid such as hydrochloric acid to promote dissolution of the salt, the inert carrier particles are mixed with that solution and a stannous tin salt, such as stannous chloride, is then added to preferably form a paste. A solvent such as isopropyl alcohol, acetone, ethyl acetate or a combination of such solvents is suitable. The reduction product will adsorb on the inert carrier particles introduced into the reaction medium prior to reduction. For example, in the following reaction, the amount of palladium is determined stoichiometrically by that ratio limits of $Sn^{+2}/Pd^{+2}$ in a weight range of 0.50 to 2.50 (w/w):

$$Sn^{+2} + Pd^{+2} \rightarrow Sn^{+4} + Pd^0$$

The above described reaction may be carried out using initial metal containing solutions formed at room or elevated temperature as shown in the following examples:

| Cold: | | |
|---|---|---|
| Anhydrous acetone | 990 to | 999 ml |
| 36% Hydrochloric acid | 10 to | 1 ml |
| PdCl$_2$ | 30 to | 1 gm |
| Warm: (~56° C.) | | |
| Anhydrous acetone | 990 to | 999 ml |
| 36% Hydrochloric acid | 10 to | 1 ml |
| PdCl$_2$ | 80 to | 1 gm |

When the catalytic palladium particles are prepared as a warm solution, it is preferable to cool the solution slowly in order to obtain a high concentration of palladium and minimize loss of acetone from the solution.

The catalytic palladium adsorbed onto the inert carrier particles are then dispersed in the liquid coating composition and dispersion may be assisted by stirring or preferably ultrasonic agitation to break colloidal agglomerates.

Catalytic particles of silver are made in a manner similar to those of palladium. Any soluble silver salt may be used in the formation of the particles provided they pass through a silver hydroxide or oxide stage during reduction. Reduction of the silver ion at its redox potential of $+0.80$ v $+/-0.15$ v is carried out with an inorganic or organic reducing agent with stannous tin preferred. Redox reactions for the reduction of silver comprise:

$$Sn^{+2} \rightarrow Sn^{4+} + 2e$$

and $$2Ag^+OH^- + 2e \rightarrow 2Ag^0 + 2OH^-$$

or:

$$Sn^{+2} + 2Ag^+OH^- \rightarrow 2Ag^0 + 2OH^- + Sn^{+4}$$

Suitable solvents for dissolving the silver salts include those listed above for palladium. As in the formation of the palladium particles, the inert carrier particles are introduced into solution followed by a salt of the reducing agent. Reduction will again cause adsorption of the reduced metal on the inert carrier particles introduced into the reaction medium. The ratio of tin to silver present in the formulation are determined stoichiometrically as follows (w/w):

$$Sn^{+2}/Ag^{30} = 0.40 \text{ to } 2.50$$

As with the palladium particles, ultrasonic agitation may be used to better disperse the particle in solution.

Following the formation of the catalytic particles coated with a platinum family metal and catalytic particles coated with silver, and the dilution of these solutions with the liquid coating composition or additional solvent, the two catalytic particle solutions are mixed together and diluted as required with additional coating composition to form a single electroless plating catalyst composition. The ratio of the silver to the platinum family metal in the electroless plating catalyst (expressed as a weight ratio of metallic silver to metallic platinum family metal) may vary between about 100 to 1 to 1 to 1, preferably between 50 to 1 and 2 to 1 and most preferably, between about 20 to 1 and 5 to 1. The total weight of metal in the combined solution (platinum family metal plus silver expressed as metal) may vary from about 0.1 to 50.0 grams per liter of solution and more preferably, from about 10 0 to 25.0 grams per liter. The metal should comprise from about 1 to 35 percent by weight of the total weight of the catalytic particles.

A made up plating catalyst solution ready for use will contain catalytic particles, other dissolved solids conventionally found within the coating composition—i.e., resins, polymers, pigments, etc., hereinafter referred to as the "dried coating solids", and the solvent for the coating composition. In a preferred embodiment of the invention, the concentration of the dried coating solids by weight to the catalytic particles in the made up plating catalyst solution varies from about 2 to 1 to 50 to 1 and more preferably, varies from about 3 to 1 to 25 to 1.

Nonconductive substrates capable of metal plating using the plating catalyst of the invention include polymers such as polyphenylene oxide, acrylonitrile-butadiene-styrene (ABS) copolymers, polystyrene, polycarbonate, epoxy resins, polyvinyl chloride, polyethylene, polypropylene, polyethylene oxide terephthalate, fluorine polymers such as polytetrafluoroethylene, and other natural and synthetic polymers and blends of the aforesaid. The substrate may also include non-metallic materials such as silicate and non-silicate glasses, for example, quartz, soda lime float or plate glass, borosilicate, lead borate, alumino-silicate, alumina ceramic and tin oxide.

Application of the catalytic coating is by use of standard methods and equipment. A substrate is pretreated using standard methods and the coating is preferably applied by spraying, although brushing or other means of selectively applying the coating are applicable. Surfaces that are not to be coated are masked prior to application of the coating.

Following application of a catalytic coating, the mask is removed whereby the catalyzed coating is over the substrate in a selective pattern. Preferably, the catalyzed coating is dried prior to electroless plating. Using the coating of the present invention, a recommended period of air drying is from 15 to 20 minutes followed by oven drying at a temperature not exceeding 70° C. for a period of time up to about 60 minutes. This cures the coating and promotes adhesion of the catalytic coating to the substrate and an electroless metal plate over the catalytic coating. During drying, solvents present in the catalyst solution act to solvate the substrate and create a stronger bond between the substrate and the coating. Entrapped catalytic particles microscopically protrude from the surface and provide activation sites for subsequent electroless metal deposition.

Electroless metal plating is accomplished using standard prior plating solutions such as those disclosed in U.S. Pat. Nos. 3,765,936; 3,728,137; and 3,661,597, all incorporated herein by reference. Other electroless plating solutions known to those skilled in the art would also be suitable for purposes of the subject invention. For EMI shielding, a dual layer of electroless copper followed by electroless nickel is preferred. Such a dual layer is disclosed in the above referenced U.S. Pat. No. 4,514,486. Using the process of this invention, including masking means to obtain selectivity, EMI shields are obtained in a selective pattern whereby the aesthetic features of a molded housing, for example, are preserved, while an effective EMI shield is provided.

The invention will be better understood by reference to the examples which follow. These examples are not intended to limit the scope of the invention.

EXAMPLE 1

This example represents the preferred embodiment of the invention and represents one process for the preparation of an electroless plating catalyst.

Step 1 - Catalytic palladium particles are prepared using the following formulation:

| | |
|---|---|
| Palladium chloride[1] | 1.34 grams |
| Stannous chloride[2] | 1.43 grams |
| Ethyl Acetate | 80.00 ml |
| Silica Type ED 30 | 37.50 grams |
| Polycarbonate Varnish[3] | 500.00 ml |

[1]Added as 67 ml of a 2% of palladium chloride in acetone containing 1% hydrochloric acid.
[2]Added as 14.3 ml of a 10% of stannous chloride in isopropyl alcohol.
[3]L123 Varnish from Bee Chemicals.

The palladium chloride and silica particles are added to the solvent with stirring. The stannous chloride dissolved in ethyl acetate is then added to form a paste. Following reduction, the varnish is added with stirring and ultrasonic agitation to disperse any agglomerates formed.

Step 2 - Catalytic silver particles are prepared using the following formulation:

| | |
|---|---|
| Silver Hydroxide | 13.40 grams |
| Isopropyl Alcohol | 5.00 ml |
| SnCl$_2$[1] | 20.10 grams |
| Silica Type ED 30 | 37.50 grams |
| Varnish (LS123) | 500.00 ml |

[1]Added as 100.5 ml of a 20% solution of stannous chloride in isopropyl alcohol.

The silver hydroxide, silica particles and isopropyl alcohol are mixed with stirring. The stannous chloride is then added to form a paste. Following reduction, the varnish is added with stirring and ultrasonic agitation is used as needed to disperse any agglomerates formed.

Step 3 - The solution of the catalytic palladium particles formed in step 1 is combined with the solution of the catalytic silver particles formed in step 2 to provide an electroless plating catalyst of the following composition where all concentrations are in percent by weight:

| | |
|---|---|
| Silica particles | 75.00 grams per liter |
| Palladium | 0.80 grams per liter |
| Silver | 6.40 grams per liter |
| Ratio of silver to palladium | 8:1 |

EXAMPLE 2

This example represents the preparation of an electroless plating catalyst having a formulation differing somewhat from that of Example 1.

Step 1 - Catalytic palladium particles are prepared using the following formulation:

| | |
|---|---|
| Palladium chloride[1] | 1.34 grams |
| Stannous chloride[2] | 1.43 grams |
| Ethyl Acetate | 160.00 ml |
| Silica Type ED 30 | 50.00 grams |
| Varnish (LS123) | 500.00 ml |

[1]Added as 67 ml of a 2% aqueous solution of palladium chloride in acetone and containing 1% hydrochloric acid.
[2]Added as 14.3 ml of a 10% solution of stannous chloride in isopropyl alcohol.

The palladium chloride and silica particles are mixed into the solvents with stirring. The stannous chloride solution and ethyl acetate are then added to form a paste. Following reduction, varnish is added with stirring and ultrasonic agitation to disburse any agglomerates formed.

Step 2 - Catalytic silver particles are prepared using the following formulation:

| | |
|---|---|
| AgOH | 13.40 grams |
| Isopropyl Alcohol | 5.00 ml |
| SnCl$_2$[1] | 10.05 grams |
| Silica Type ED 30 | 50.00 grams |
| Varnish (LS123) | 500.00 ml |

[1]Added as 100.5 ml of a 20% aqueous solution of stannous chloride containing 20% isopropyl alcohol.

The silver hydroxide, silica particles and isopropyl alcohol are mixed with stirring. The stannous chloride solution is then added to form a paste. Varnish is added with stirring and ultrasonic agitation is used as needed to disperse any agglomerates formed.

Step 3 - Combine the solution of the catalytic palladium particles formed in step 1 with the solution of the catalytic silver particles formed in step 2 to provide an electroless plating catalyst of the following composition where all concentrations are in percent by weight:

| | |
|---|---|
| Silica particles | 100.00 grams per liter |
| Palladium | 0.80 grams per liter |
| Silver | 6.40 grams per liter |
| Ratio of silver to palladium | 8:1 |

EXAMPLE 3

A portion of a polycarbonate housing was masked and prepared for plating. One liter of the formulation of Example 1 was diluted with 50 ml of a composite thinner (54 volume percent acetone, 22 percent isopropyl alcohol and 24 percent ethyl acetate) and sprayed onto the polycarbonate substrate. The coating was applied at a wet thickness of about 3 mils at 25 psi air pressure. Following spraying, the coated part was allowed to air dry for about 15 minutes and then placed in a hot air convection oven and dried at 60° C for 45 minutes to provide a final dried coating of about 0.5 mil thickness.

Following drying, the mask was removed and the substrate plated by immersion in a proprietary electroless copper plating solution identified as Cuposit ® 251 electroless copper and comprising cupric ions, complexing agent, formaldehyde and hydroxide for pH control. The plating solution was maintained at 40° C. Plating was initiated in about 2 minutes and plating continued for 30 minutes. Following plating, the substrate had a coating of copper about 0.1 mil thick deposited only on the areas of the substrate spray coated with the electroless plating catalyst. The deposit obtained had a relatively smooth matt pink finish of copper. Testing of suitability of the part as an EMI shield showed results of <0.02 ohms/sq.

I claim:

1. An electroless plating catalyst solution comprising a polymer solution having a mixture of catalytic particles homogeneously dispersed therein, said mixture of catalytic particles comprising first catalytic particles of a reduced platinum family metal absorbed into an inert particulate carrier and second catalytic particles of reduced silver adsorbed onto an inert particulate carrier, said particles having a metals content whereby the weight ratio of silver to the platinum family metal varies between about 100:1 and 1:1.

2. The catalyst solution of claim 1 where the particle size of the inert particulate carrier particles range between 1 and 100 microns.

3. The catalyst solution of claim 1 where the liquid film forming coating composition is a varnish.

4. The catalyst solution of claim 1 where the liquid film forming coating composition contains a polymer selected from the group consisting of phenolics, epoxies, alkyds, polyesters, acrylics, polyurethanes and polyamides.

5. The catalyst solution of claim 1 where the concentration of said platinum family metal in the electroless plating catalyst varies from about 0.1 to 100 grams per liter of solution.

6. The catalyst solution of claim 5 where the concentration of said platinum family metal varies from about 1.0 to 10.0 grams per liter of solution.

7. The catalyst solution of claim 1 where the concentration of silver in the electroless plating catalyst varies from about 1.0 to 100 grams per liter of solution.

8. The catalyst solution of claim 7 where the concentration varies from about 3.0 to 20.0 grams per liter of solution.

9. The catalyst solution of claim 1 wherein the concentration of said platinum family metal varies from about 1.0 to 10 grams per liter of solution, the concentration of silver varies from about 3.0 to 20 grams per liter of solution and the weight ratio of silver to the platinum family metal varies between about 50:1 and 2:1.

10. The catalyst solution of claim 9 where the weight ratio of silver to the platinum family metal varies between from about 20:1 and 5:1.

11. The catalyst solution of claim 9 where the weight ratio of catalytic metal to inert particulate carrier varies between about 1:50 and 1:3.

12. The catalyst solution of claim 9 where the total of the platinum family metal and the silver in the electroless plating catalyst varies between 0.1 and 50 grams per liter.

13. The catalyst solution of claim 12 where the total of the platinum family metal and the silver varies between 10.0 and 25 grams per liter.

14. The catalyst solution of claim 1 where the weight ratio of the catalytic particles to the polymer content of the solution varies between 2:1 and 50:1.

15. The catalyst solution of claim 1 where the weight ratio of the catalytic particles to the polymer content of the solution varies between 3:1 and 25:1.

16. The catalyst solution of claim 1 where the platinum family metal is palladium.

17. The catalyst solution of claim 1 where the inert particulate carrier is chosen from the group of irregularly shaped particles selected from the group of carbon, glass, titania or silica.

18. The catalyst solution of claim 17 where the inert particulate carrier is silica.

19. An electroless plating catalyst solution consisting essentially of a polymer solution having a mixture of catalytic particles homogeneously dispersed therein, said mixture of catalytic particles consisting essentially of first catalytic particles of reduced palladium absorbed onto an inert particulate silica carrier and second catalytic particles of reduced silver adsorbed onto an inert particulate carrier, said particles having a metal content whereby the weight ratio of silver to palladium varies between about 100:1 and 1:1.

20. The catalyst solution of claim 19 where the particle size of the silica particles range between 1 and 100 microns.

21. The catalyst solution of claim 20 where the particle size of the particles range between 1 and 25 microns.

22. The catalyst solution of claim 19 where the palladium absorbed onto the inert particulate carrier is the reaction product of palladium ions and stannous tin and the silver adsorbed onto the inert particulate carrier is the reaction product of a silver compound and stannous tin.

23. The catalyst solution of claim 22 where the polymer solution is a solution of a polymer selected from the group consisting of phenolics, epoxies, alkyds, polyesters, acrylics, polyurethanes and polyamides.

24. The catalyst solution of claim 22 where the concentration of palladium in the electroless plating catalyst varies from about 0.1 to 100 grams per liter of solution.

25. The catalyst solution of claim 24 where the concentration of palladium varies from about 1.0 to 10.0 grams per liter of solution.

26. The catalyst solution of claim 22 where the concentration of silver in the electroless plating catalyst varies from about 1.0 to 100 grams per liter of solution.

27. The catalyst solution of claim 26 where the concentration of silver varies from about 3.0 to 20.0 grams per liter of solution.

28. The catalyst solution of claim 22 where the concentration of palladium in the electroless plating catalyst varies from about 0.1 to 10 grams per liter of solution, the concentration of silver varies from about 3.0 to 20 grams per liter of solution and the weight ratio of silver to palladium varies between about 50:1 and 2:1.

29. The catalyst solution of claim 28 where the weight ratio of catalytic metal to inert particulate carrier varies between about 1:50 and 1:3.

30. The catalyst solution of claim 29 where the weight ratio of the catalytic particles to the polymer content of the solution varies between 2:1 and 50:1.

31. The catalyst solution of claim 30 where the weight ratio of the catalytic particles to the polymer content of the solution varies between 3:1 and 25:1.

* * * * *